(12) United States Patent
Chan

(10) Patent No.: US 7,817,500 B2
(45) Date of Patent: Oct. 19, 2010

(54) SHOCK-ACTIVATED SWITCH DEVICE

(75) Inventor: Raymond Chan, Hong Kong (HK)

(73) Assignee: IDT Technology Limited, Kowloon (HK)

(*) Notice: Subject to any disclaimer, the term of this patent is extended or adjusted under 35 U.S.C. 154(b) by 178 days.

(21) Appl. No.: 11/372,347

(22) Filed: Mar. 10, 2006

(65) Prior Publication Data

US 2007/0211577 A1    Sep. 13, 2007

(51) Int. Cl.
G04C 17/00 (2006.01)
G04C 21/16 (2006.01)
H02N 2/18 (2006.01)

(52) U.S. Cl. .................. 368/69; 368/224; 368/255; 310/318; 310/319

(58) Field of Classification Search ........... 368/223, 368/69, 224, 250, 255; 310/317, 318, 319, 310/322, 339
See application file for complete search history.

(56) References Cited

U.S. PATENT DOCUMENTS

| | | | | |
|---|---|---|---|---|
| 4,105,902 A | * | 8/1978 | Iwai et al. | 327/187 |
| 4,242,745 A | * | 12/1980 | Mutrux | 368/73 |
| 4,663,624 A | * | 5/1987 | Bui et al. | 340/7.62 |
| 4,761,582 A | * | 8/1988 | McKee | 310/322 |
| 5,783,875 A | * | 7/1998 | Jaros | 307/116 |
| 5,946,274 A | | 8/1999 | Yamaguchi et al. | |
| 5,977,688 A | | 11/1999 | Utsunomiya et al. | |
| 6,577,559 B1 | * | 6/2003 | Fleury et al. | 368/250 |
| 6,747,916 B1 | * | 6/2004 | Fleury et al. | 368/10 |
| 6,813,223 B1 | * | 11/2004 | Born et al. | 368/255 |
| 2004/0164647 A1 | * | 8/2004 | Micko | 310/319 |

FOREIGN PATENT DOCUMENTS

GB    2 262 988 A    7/1993

* cited by examiner

Primary Examiner—Vit W Miska
(74) Attorney, Agent, or Firm—Leydig, Voit & Mayer, Ltd.

(57) ABSTRACT

A shock-activated switch device comprises a piezoelectric buzzer having a body for receiving a mechanical shock and a terminal for outputting an electrical output signal when the body receives a mechanical shock, and an output circuit connected to the terminal for converting the output signal into a logic signal for controlling an electronic circuit to execute a specific programmable function, such as alarm snooze.

12 Claims, 5 Drawing Sheets

SHOCK-ACTIVATED SWITCH DEVICE

The present invention relates to a shock-activated switch device for controlling an electronic device.

BACKGROUND OF INVENTION

Electronic devices normally have several buttons or keys to operate various functions, and more features usually require the use of either more buttons or combination of buttons.

For these products, there are often one or two popular functions that are frequently used. Most products would provide one large single function button for users' ease of access. For example, most heart rate monitor watches often include a big "quick-start" button which, upon pressing, will immediately switch the watch from the time mode to the heart rate measuring mode. Alarm clocks are another example, on which there is often a big snooze button for temporarily stopping the alarm beeps.

However, conflict may arise when there are more than one popular feature in an electronic device, and individual users may have different preference of the feature they need most. It is obviously not feasible that every feature is served by a dedicated button. The provision of a large button in some cases is difficult if not impossible, for example on a wristwatch. In certain situations, whilst a specific button has been assigned to perform a certain function, the button may be difficult to locate or press especially in a dark environment or when the user is occupied for example doing exercise.

An example of the prior art can be found in U.S. Pat. No. 5,946,274, in which there is disclosed a shock switch and a posture detecting switch that are combined into an electronic device to perform an automatic operation such as turning on of the backlight of a wristwatch. One of the disadvantages of this design is that putting so many components into a small electronic device like a wristwatch is relatively complex and expensive.

The invention seeks to obviate or at least alleviate such a problem or shortcoming by providing a novel or otherwise improved shock-activated switch device.

SUMMARY OF THE INVENTION

According to a first aspect of the invention, there is provided a shock-activated switch device comprising a piezoelectric element having a body for receiving a mechanical shock and a terminal for outputting an electrical output signal upon the body receiving a shock, and an output circuit connected to the terminal for converting said output signal into a logic signal for controlling an electronic circuit.

Preferably, the piezoelectric element is capable of producing a sound upon application of an electrical signal at its terminal.

More preferably, the piezoelectric element comprises a piezoelectric buzzer.

It is preferred that the output circuit comprises an amplifying circuit for amplifying said output signal and a shaping circuit for subsequently shaping said output signal.

According to a second aspect of the invention, there is provided an electronic device incorporating the shock-activated switch device as claimed in claim 1, further comprising a casing and an operating circuit including a control unit in the casing, wherein the body of the piezoelectric element is located in fixed relationship to the casing for receiving said shock applied to the casing, and the terminal of the piezoelectric element is connected to provide said output signal to the control unit for causing the control unit to perform a specific function.

Preferably, the body of the piezoelectric element is fixed firmly to the casing for vibration therewith.

More preferably, the body of the piezoelectric element comprises a planar base which is located flat against an inner surface of the casing.

In a preferred embodiment, the control unit is capable of performing at least two functions in response to said output signal from the terminal of the piezoelectric element, and includes selection means to enable user selection of one of these functions for execution.

It is preferred that the piezoelectric element is connected to the operating circuit for operation thereby to provide an audio signal.

Preferably, the electronic device is a sports watch.

Preferably, the electronic device is an alarm clock.

BRIEF DESCRIPTION OF DRAWINGS

The invention will now be more particularly described, by way of example only, with reference to the accompanying drawings, in which.

DETAILED DESCRIPTION OF PREFERRED EMBODIMENTS

Figure 1:
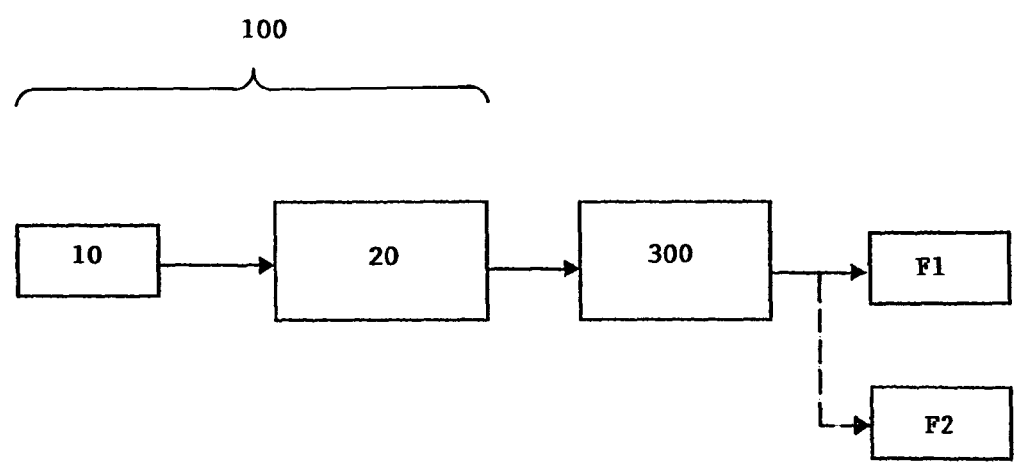
FIG. 1 is a functional block diagram of an embodiment of a shock-activated switch device in accordance with the invention.
Figure 2:
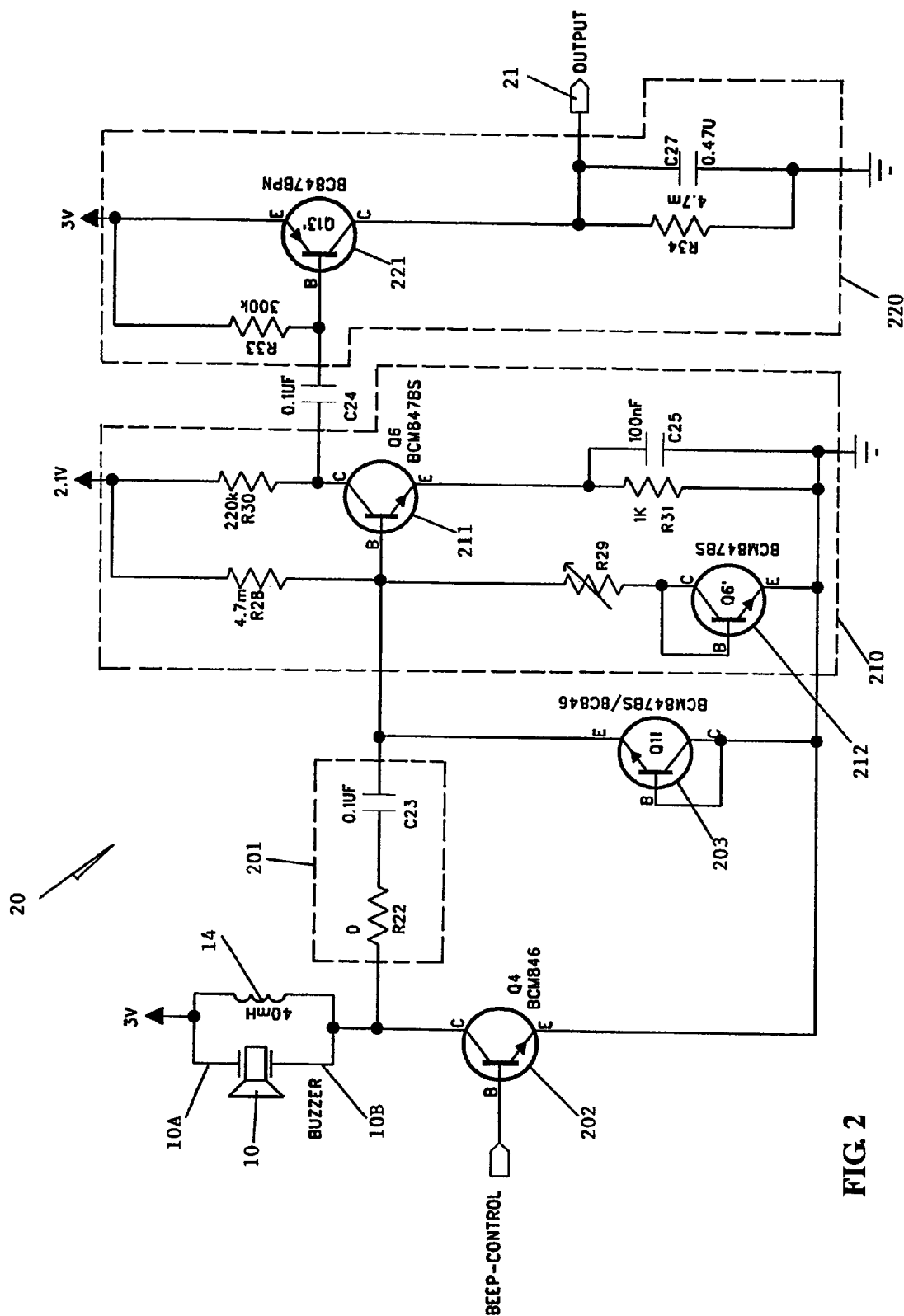
FIG. 2 is a detailed circuit diagram of the switch device of FIG. 1.

Referring initially to FIGS. 1 to 4 of the drawings, there is shown a shock-activated or tap-on switch device 100 embodying the invention, which comprises a piezoelectric element 10 and an output circuit 20 therefor. The piezoelectric element 10 is implemented conveniently by a piezoelectric buzzer 10 which is made of piezoelectric crystals or ceramics 11 adhered on a planar copper base disc 12, together constituting a body 13 that may experience or receive a mechanical shock, impact or vibration caused by tapping for example.

The base disc 12 and the outer surface of the piezoelectric ceramics 11 serve as the positive and negative terminals of the buzzer 10, i.e. anode 10A and cathode 10B respectively. Upon application of an AC voltage across the terminals 10A and 10B, the piezoelectric ceramics 11 will change shape by a small amount to thereby produce a sound. In the reversed operation, while the anode 10A is connected to a positive voltage source, the cathode 10B will output an electrical signal upon the piezoelectric ceramics 11 or the buzzer body 13 in general being subjected to a shock or tapping.

The buzzer 10 operates as a shock sensor or detector that provides an output signal (hereinafter referred to as the buzzer signal) upon activation by a small shock. With connection to the cathode 10B, the output circuit 20 is designed to convert the buzzer signal from an analogue signal into a logic high signal for controlling an MCU (microprocessor control unit) 300 of the operating circuit of an electronic device such as a sports watch 400 (FIGS. 3 and 4) or an alarm clock 500 (FIG.

5). The buzzer 10 is preferably also in use for performing the more commonly known function i.e. emitting a sound as for example an alarm signal or key-press beep.

The buzzer 10 is provided with a shunt coil 14, having its anode 10A connected to 3V and its cathode 10B to the earth via the collector and emitter of an NPN transistor 202. The transistor 202 is part of the operating circuit that implements the general operation of the electronic device. Its base acts as an input for receiving a beep control signal to switch the transistor 202 at a frequency of say 2 kHz to 4 kHz, thereby driving the buzzer 10 to produce a beep sound.

The output circuit 20 is implemented by an amplifying circuit 210 connected to the cathode 10B of the buzzer 10 for amplifying the buzzer signal and a shaping circuit 220 for subsequently shaping the amplified buzzer signal to a logic (high) signal. The original buzzer signal is typically of a frequency of say 5 kHz and a duration of about 2.2 ms, having an amplitude that exceeds 0.35V for recognition or detection by the output circuit 20.

The amplifying circuit 210 incorporates an NPN transistor 211 (Q6) as the main active element, whose base, collector and emitter are connected with first and second resistors R28 and R30 to 2.1V and a third resistor R31 in parallel with a capacitor C25 to the earth respectively as shown. Included is a second NPN transistor 212 (Q6') connected to act as a diode in series with a variable resistor R29 from the base of the main transistor 211 to the earth for temperature compensation. A further NPN transistor 203 is connected to act as a reversely-biased diode from the base of the main transistor 211 to the earth for protection against reverse biasing.

The base of the main transistor 211 is connected to the cathode 10B of the buzzer 10 by means of a coupling circuit 201 formed by a resistor R22 and capacitor C23 connected in series for impedance/voltage matching. The collector of the transistor 211 outputs the amplified buzzer signal via a capacitor C24 to the shaping circuit 220.

The shaping circuit 220 is implemented by a PNP transistor 221 (Q13'), whose base inputs the amplified buzzer signal. The emitter and base of the transistor 221 are connected directly and via a resistor R33 to 3V respectively, and its collector is connected via a resistor R34 in parallel with a capacitor C27 to the earth. The collector acts as an output terminal 21 of the overall output circuit 20 and provides a logic high (3V) signal (for the MCU 300) upon conduction of the transistor 221 as triggered by the buzzer signal generated by the buzzer 10 and boosted by the amplifying circuit 210.

Figure 3:
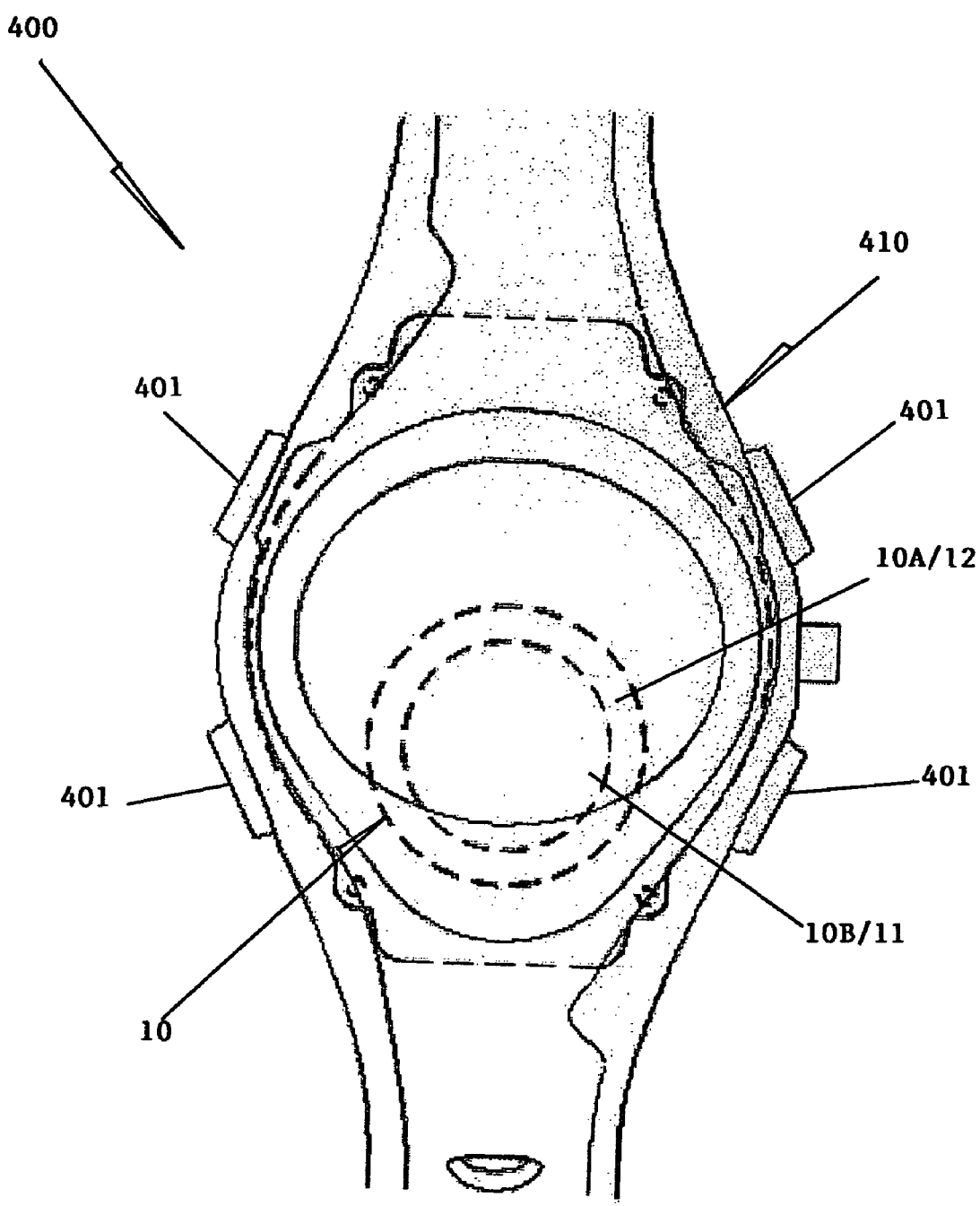
FIG. 3 is a schematic front view of a first electronic device incorporating the switch device of FIG. 1.
Figure 4:
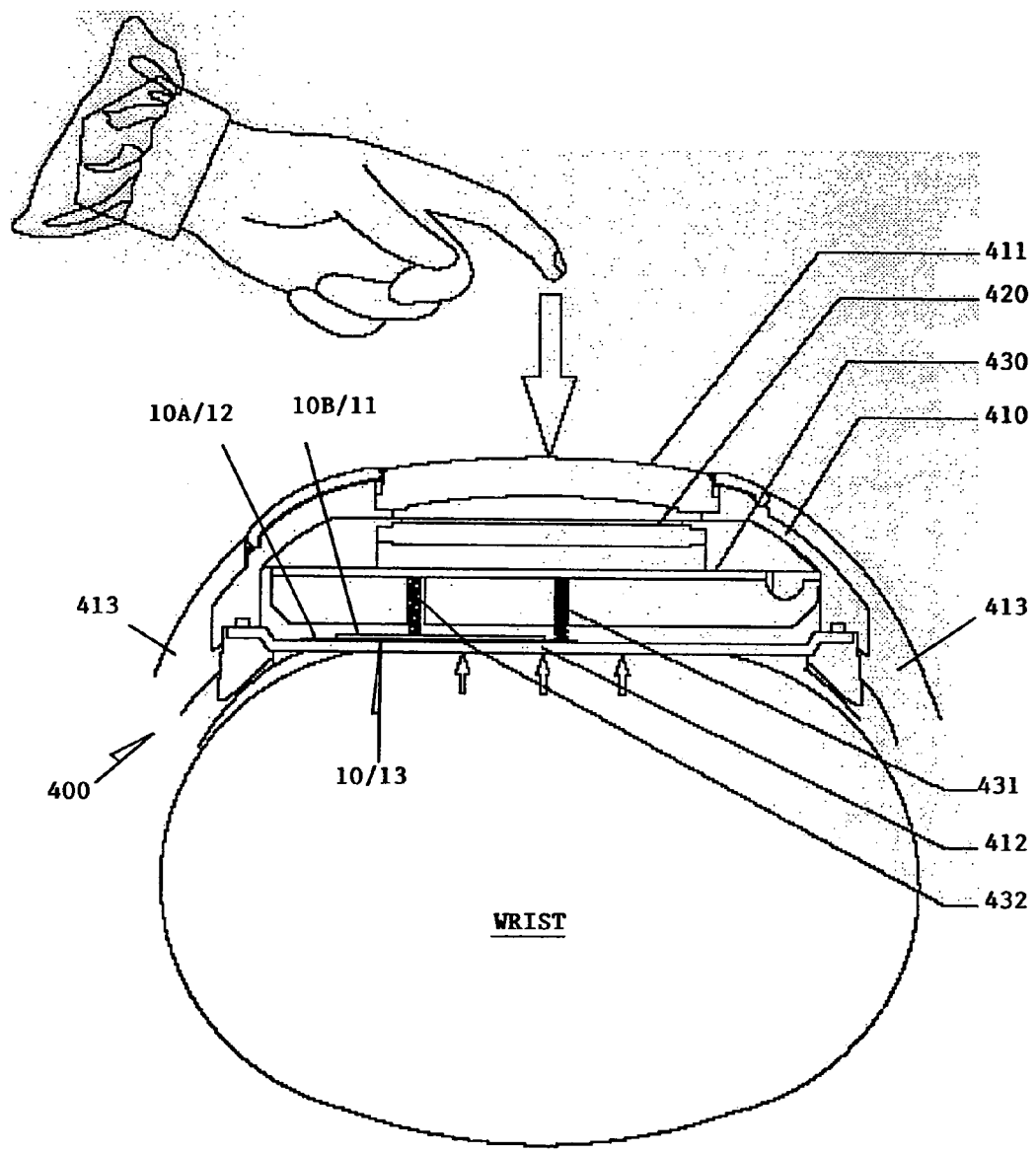
FIG. 4 is a schematic side view of the electronic device of FIG. 3 worn on a wrist.

FIGS. 3 and 4 show a first electronic device i.e. the sports watch 400 incorporating the subject tap-on switch device 100, which has a plastic watch case 410 having four control keys 401 and connected with a pair of plastic straps 413. The watch case 410 includes a plastic front lens 411 and is closed by a metal back cover 412, housing therein an LCD display 420 mounted on a printed circuit board 430 which carries the electronic operating circuit including the MCU 300 and also the output circuit 20 of the switch device 100.

The buzzer 10 is located inside the watch case 410 and is fixed thereto such that any shock that is applied to the case 410 will reach or be received by the buzzer 10. More specifically, the buzzer base disc 12 is located flat against the inner surface of the back cover 412 and is secured firmly thereto by gel or glue for example. The buzzer anode 10A (i.e. the base disc 12) and cathode 10B (i.e. the piezoelectric ceramics 11) are electrically connected to the circuit board 430 by respective contact springs 431 and 432 that extend through the circuit components as shown. By means of the spring 432, the buzzer output i.e. the cathode 10B is connected via the output circuit 20 to the MCU 300.

The sports watch 400 is used as a wristwatch for timekeeping including timer and alarm functions, etc. and also as a heart rate monitor for measuring and calculating the heart rate and related sports data. These functions are performed by or under the control of the MCU 300.

The tap-on switch device 100 is installed completely inside the watch case 410 and is used to trigger the MCU 300 to perform a specific function that can be chosen from a number of predetermined functions, such as switching the mode of operation from time mode to heart rate mode (F1), acting as a snooze button (F2) for temporarily inhibiting an alarm (F2), or acting as a start/stop button for stop watch function. A user simply following manual (or on-screen) instructions can program or assign, for example by using the keys 401 of the watch 400, one of those functions to the switch device 100 such that the switch device 100 may be used to execute that function to meet his/her personal need or preference.

In operation, upon the user tapping on the watch case 410, for example on the watch lens 411, the shock or vibration resulting from the tapping is transmitted via the body of the watch case 410 to reach the back cover 412 and hence the buzzer 10 in firm contact therewith. Upon vibration, the buzzer 10 outputs a voltage signal by piezoelectric action, which is fed by the springs 431 to the output circuit 20 and 432 for amplification and then shaping into a logic high signal for triggering the MCU 300 to execute the programmed function, for example switching from time mode to heart rate mode (F1).

Figure 5:
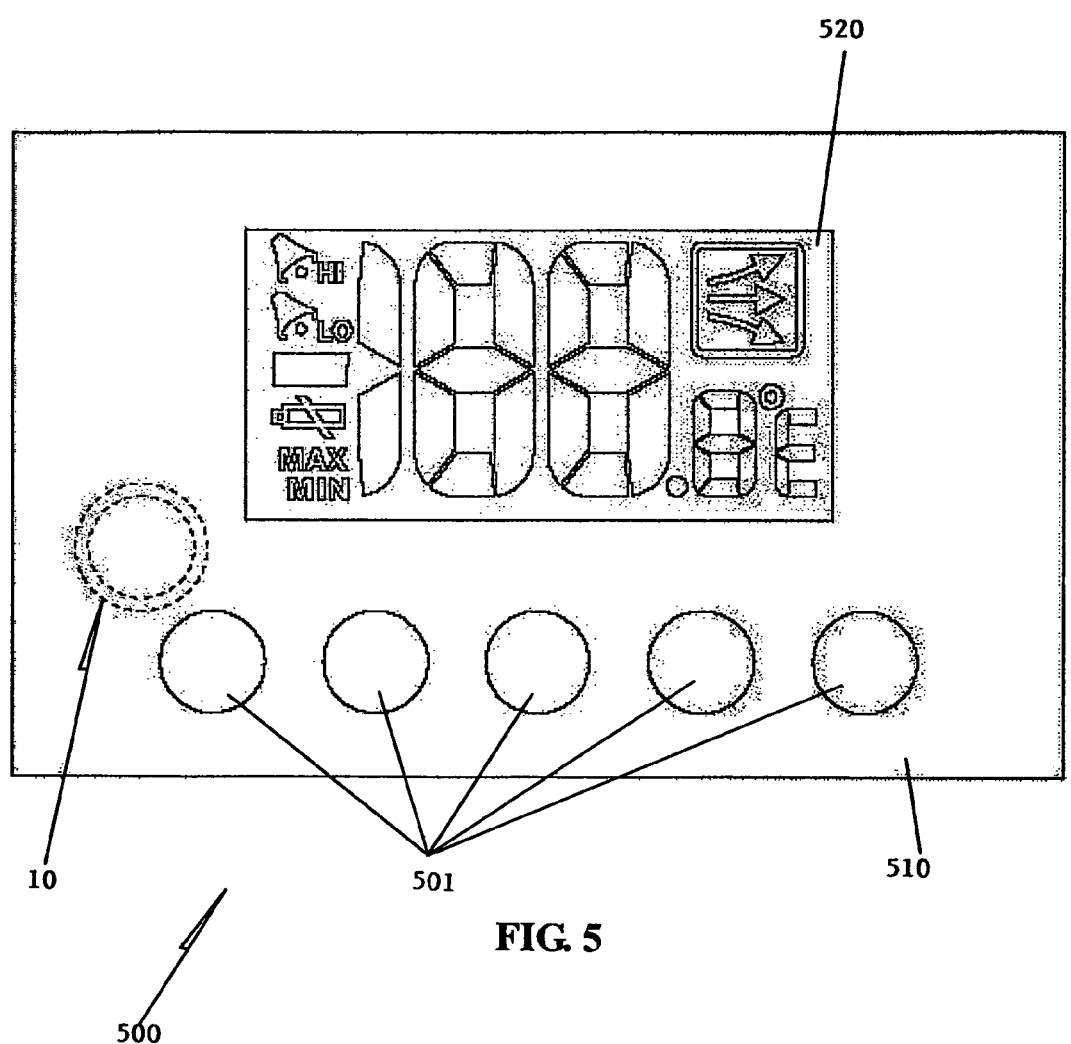
FIG. 5 is a schematic front view of a second electronic device incorporating the switch device of FIG. 1.

FIG. 5 shows a second electronic device i.e. the alarm clock 500 utilizing the same shock-activated/tap-on switch device 100, which has a plastic casing 510, an LCD display 520 and five control keys 501. The electronic operating circuit including the MCU 300 and the output circuit 20 of the switch device 100 are mounted on a printed circuit board located in the casing 510. The buzzer 10 is attached/mounted directly and firmly against the inner surface of the front or rear wall of the casing 510 by glue for example, such that detection by the buzzer 10 of tapping on the casing 510 is more effective.

The operation is essentially the same. Upon the user tapping on the clock casing 510, the shock or vibration caused by the tapping is transmitted via the body of the casing 510 to reach the buzzer 10, which upon vibration outputs a voltage signal by piezoelectric action, and the signal is amplified and shaped by the output circuit 20 to trigger the MCU 300 to execute the programmed function, for example to snooze an alarm (F2).

Implementation of the subject shock-activated switch device is based on a piezoelectric element or buzzer which inherently exists in most electronic devices that are required to make a sound in use, for example to generate a beep alert message. The switch device utilizes the readily available or otherwise wasted reversed piezoelectric action of the buzzer, without incurring much extra cost (say, only for a few transistors and resistors). No special or complicate vibration/shock sensor is needed.

The switch device is extremely easy and convenient to operate, even in the dark or when the user is occupied e.g. doing exercise, by simply tapping (or patting, knocking etc.) the casing/housing or body of the electronic device in which the switch device is used. The advantages achieved are certainly well worth the small extra cost in production.

The invention has been given by way of example only, and various modifications of and/or alterations to the described embodiments may be made by persons skilled in the art without departing from the scope of the invention as specified in the appended claims.

The invention claimed is:

1. A shock-activated switch device comprising:
a piezoelectric element having
  a body,
  a first terminal connected to a power source, and
  a second terminal outputting an electrical output signal in response to a mechanical shock applied to the body, the second terminal also receiving an electrical input signal for outputting of an audible sound by the piezoelectric element;
a reactive electrical circuit element fixedly electrically connected to the first and second terminals of the piezoelectric element and thereby electrically connected in parallel with the piezoelectric element;
an output circuit connected to the second terminal of the piezoelectric element and converting the electrical output signal, output in response to a mechanical shock applied to the body, into a logic signal for controlling an electronic circuit, wherein the output circuit comprises
  an amplifying element having an input coupled to the second terminal of the piezoelectric element for amplifying the electrical output signal, output in response to a mechanical shock applied to the body, and producing an amplified output signal,
  a temperature compensation element connected between the input of the amplifying element and ground, compensating for changes in temperature of the amplifying element, and
  a shaping circuit receiving and shaping the amplified output signal into the logic signal, the shaping circuit comprising
    at least one biasing resistor, and
    only a single electronic switch that is connected to the at least one biasing resistor and closed only when the amplified output signal is applied to the single electronic switch, the single electronic switch supplying a direct current voltage to an output terminal as the logic signal; and
an input circuit connected to the second terminal for receiving a beep control signal and, in response to receiving a beep control signal, applying the electrical input signal to the piezoelectric element so that, in response to the electrical input signal, the piezoelectric element generates the audible sound.

2. An electronic device incorporating the shock-activated switch device as claimed in claim 1, further comprising a casing and an operating circuit including a control unit in the casing, wherein the body of the piezoelectric element is located in fixed relationship to the casing for receiving a mechanical shock applied to the casing, and the second terminal of the piezoelectric element is connected to provide the output signal to the control unit for causing the control unit to perform a specific function.

3. The electronic device as claimed in claim 2, wherein the body of the piezoelectric element is fixed to the casing for vibration with the casing.

4. The electronic device as claimed in claim 3, wherein the body of the piezoelectric element comprises a planar base which is located against an inner surface of the casing.

5. The electronic device as claimed in claim 2, wherein the control unit performs at least two functions in response to the output signal from the second terminal of the piezoelectric element, and includes selection means to enable user selection of one of the at least two functions for execution.

6. The electronic device as claimed in claim 2, wherein the piezoelectric element is connected to the operating circuit to provide an audio signal.

7. The electronic device as claimed in claim 2, being a sports watch.

8. The electronic device as claimed in claim 2, being an alarm clock.

9. The shock-activated switch device as claimed in claim 1, wherein the reactive electrical circuit element is an inductor.

10. The shock-activated switch device as claimed in claim 1, wherein the temperature compensation element comprises a diode-connected transistor.

11. The shock-activated switch device as claimed in claim 1, wherein the output circuit comprises a bias protection element connected in parallel with the temperature compensation element for preventing polarity inversion of a bias voltage applied to the input of the amplifying element.

12. The shock-activated switch device as claimed in claim 11, wherein the bias protection element comprises a diode-connected transistor.

* * * * *